United States Patent
Wada et al.

(10) Patent No.: US 7,609,046 B2
(45) Date of Patent: Oct. 27, 2009

(54) CONSTANT VOLTAGE CIRCUIT

(75) Inventors: Hirofumi Wada, Osaka (JP); Atsuo Inoue, Kyoto (JP); Noriaki Matsuno, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/233,853

(22) Filed: Sep. 19, 2008

(65) Prior Publication Data

US 2009/0121700 A1     May 14, 2009

(30) Foreign Application Priority Data

Nov. 8, 2007     (JP) .............................. 2007-291170

(51) Int. Cl.
     *G05F 3/16* (2006.01)
(52) U.S. Cl. ...................... 323/316; 323/317
(58) Field of Classification Search ................ 323/313, 323/314, 315, 316, 317, 907
     See application file for complete search history.

(56) References Cited

U.S. PATENT DOCUMENTS

| | | |
|---|---|---|
| 6,937,001 B2 | 8/2005 | Ueda |
| 7,233,136 B2 | 6/2007 | Makino et al. |
| 7,256,643 B2 | 8/2007 | Pan et al. |
| 7,414,384 B2 * | 8/2008 | Kimura ...................... 323/274 |
| 2007/0241736 A1 | 10/2007 | Oriwara et al. |

FOREIGN PATENT DOCUMENTS

JP        08-185232        7/1996

* cited by examiner

*Primary Examiner*—Shawn Riley
(74) *Attorney, Agent, or Firm*—McDermott Will & Emery LLP (57) ABSTRACT

An inverse temperature characteristic generating circuit decreases an output voltage $V_{out}$ by a voltage $V_{GS}$, and supplies the resultant voltage as a voltage VA to a temperature characteristic generating circuit. The temperature characteristic generating circuit includes a differential amplification circuit that receives a terminal voltage $V_{AP}$ between resistances $R_{22}$ and $R_{23}$ and an emitter voltage $V_{AM}$ of a bipolar transistor $T_{21}$, and outputs a control signal VC. When the terminal voltages $V_{AP}$ and $V_{AM}$ are equal to each other, an operation of a circuit is stable. The temperature characteristic of the voltage VA during the stable operation, and the temperature characteristic of the voltage $V_{GS}$ are inverse to each other and therefore cancel each other, so that the constant voltage $V_{out}$ independent of temperature is output. In addition, the output terminal is not connected via a resistance to a ground, so that low current consumption can be easily achieved.

7 Claims, 8 Drawing Sheets

CONSTANT VOLTAGE CIRCUIT

CROSS REFERENCE TO RELATED APPLICATIONS

This Non-provisional application claims priority under 35 U.S.C. §119(a) on Patent Application No. 2007-291170 filed in Japan on Nov. 8, 2007, the entire contents of which are hereby incorporated by reference.

BACKGROUND OF THE INVENTION

1. Field of the Invention

The present invention relates to a constant voltage circuit for generating a constant voltage, and more particularly, to a technique for a circuit capable of generating a constant voltage independent of temperature.

2. Description of the Related Art

Figure 11:
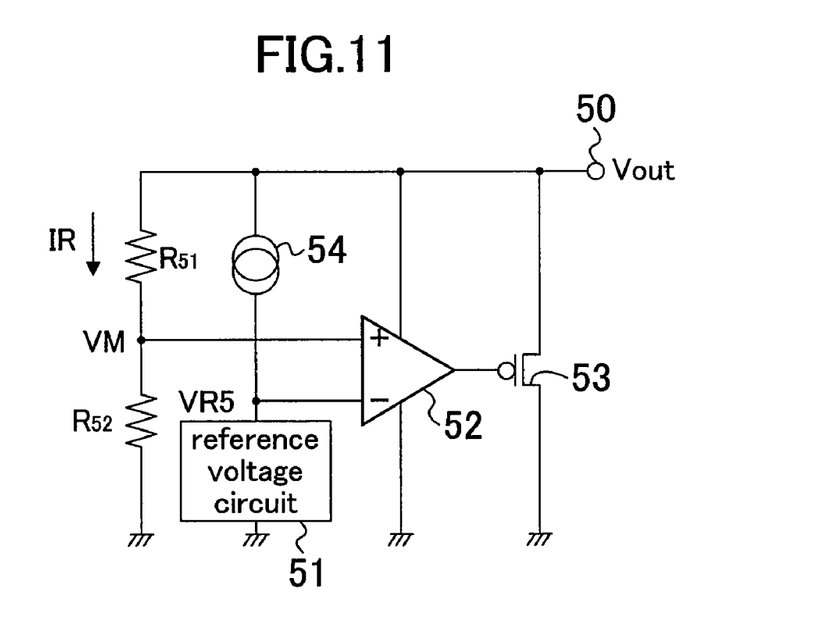
FIG. 11 is a diagram showing a configuration of a conventional constant voltage circuit.

FIG. 11 is a diagram showing a configuration of a conventional constant voltage circuit capable of generating a constant voltage independent of temperature. A series circuit of a constant current source 54 and a reference voltage circuit 51, the source and drain of an NPN transistor 53, the power source and ground ends of a differential amplification circuit 52, and a series circuit of resistances $R_{51}$ and $R_{52}$, are each connected between an output terminal 50 for outputting an constant voltage $V_{out}$ and a ground. The constant current source 54 applies a constant current to the reference voltage circuit 51, which in turn generates a predetermined reference voltage VR5 independent of temperature. The reference voltage VR5 is input to the inverting input of the differential amplification circuit 52. The series circuit of the resistances $R_{51}$ and $R_{52}$ is a resistor-divider circuit for dividing the constant voltage $V_{out}$ to generate a fractional voltage VM. The fractional voltage VM is input to the non-inverting input of the differential amplification circuit 52. The differential amplification circuit 52 amplifies a voltage difference between the input reference voltage VR5 and the fractional voltage VM and outputs the result to the gate of the NPN transistor 53.

In the circuit of FIG. 11, when the constant voltage $V_{out}$ increases, the fractional voltage VM may become higher than the reference voltage VR5, so that the output level of the differential amplification circuit 52 increases. Therefore, the NPN transistor 53 increases a current that flows from the output terminal 50 to the ground so as to decrease the constant voltage $V_{out}$. When the constant voltage $V_{out}$ decreases, the fractional voltage VM may become lower than the reference voltage VR5, so that the output level of the differential amplification circuit 52 decreases. Therefore, the NPN transistor 53 decreases a current flowing from the output terminal 50 to the ground so as to increase the constant voltage $V_{out}$. Specifically, the constant voltage $V_{out}$ is controlled so that the reference voltage VR5 is equal to the fractional voltage VM, thereby making it possible to cause the constant voltage $V_{out}$ to be independent of temperature and proportional to the predetermined reference voltage VR5 that is independent of temperature.

(Patent Document 1) Japanese Unexamined Patent Application Publication No. H08-185232

However, in the circuit of FIG. 11, the temperature-independent reference voltage VR5 has a fixed voltage value for each set of manufacturing conditions, i.e., the voltage value cannot be freely set. Therefore, in order to allow the constant voltage $V_{out}$ to be freely set, the series circuit of the resistances $R_{51}$ and $R_{52}$ for generating the fractional voltage VM that is input to one of the inputs of the differential amplification circuit 52, needs to be provided as a circuit having a current path different from that of the constant current source 54 that supplies a current to the reference voltage circuit 51 that generates the reference voltage VR5. Therefore, when the current consumption of the constant voltage circuit is reduced, the current consumption of the three circuits, i.e., the constant current source 54, the series circuit of the resistances $R_{51}$ and $R_{52}$, and the differential amplification circuit 52, needs to be reduced, and therefore, it is difficult to design low current consumption. Particularly, the current consumption of the series circuit of the resistances $R_{51}$ and $R_{52}$ is large since it is connected between the output terminal 50 of the constant voltage $V_{out}$ and the ground. Therefore, an additional circuit configuration is required to design low current consumption, resulting in a non-negligible influence on manufacturing cost. Also, the circuit scale of the constant current source 54 or the reference voltage circuit 51 needs to be increased so as to cause the circuit reference voltage VR5 to be independent of temperature.

SUMMARY OF THE INVENTION

An object of the present invention is to provide a constant voltage circuit for generating a constant voltage independent of temperature that can be easily designed to have low current consumption while suppressing an increase in circuit scale.

According to a first aspect of the present invention, a constant voltage circuit is provided for outputting a constant voltage from an output terminal thereof. The constant voltage circuit comprises an output voltage control circuit for receiving a control signal and controlling a voltage of the output terminal in accordance with the control signal, a temperature characteristic generating circuit for generating the control signal, and an inverse temperature characteristic generating circuit for decreasing the voltage of the output terminal by a predetermined voltage and supplying the resultant voltage to the temperature characteristic generating circuit. The temperature characteristic generating circuit includes a first and a second diode property element having a first terminal and a second terminal, where a forward current flows from the first terminal to the second terminal, and the second terminal is grounded, a first resistance provided between a voltage input end via which the voltage supplied from the inverse temperature characteristic generating circuit is input thereto, and the first terminal of the first diode property element, a second and a third resistance provided the voltage input end and the first terminal of the second diode property element, where the second and third resistances are connected in series, and a differential amplification circuit for receiving a first terminal voltage between the second and third resistances, and a second terminal voltage of the first terminal of the first diode property element, and outputting the control signal. The temperature characteristic generating circuit has predetermined temperature characteristic with respect to the supplied voltage under conditions such that the first and second terminal voltages are equal to each other. The inverse temperature characteristic generating circuit has inverse temperature characteristic that cancel the predetermined temperature characteristic possessed by the temperature characteristic generating circuit with respect to the predetermined voltage by which the voltage of the output terminal is decreased.

In the first aspect of the present invention, the inverse temperature characteristic generating circuit decreases the voltage of the output terminal by a predetermined voltage and supplies the resultant voltage to the temperature characteristic generating circuit. The temperature characteristic generating circuit receives the voltage supplied from the inverse temperature characteristic generating circuit and outputs a control signal to the output voltage control circuit. The temperature characteristic generating circuit includes a configuration in which the first resistance and the first diode property element are connected and a configuration in which the second and third resistances and the second diode property element are connected, between the voltage input end to which the supplied voltage is input and the ground. The constant voltage circuit further includes the differential amplification circuit that receives the first terminal voltage between the second and third resistances, and the second terminal voltage between the first resistance and the first diode property element, and outputs a control signal. The inverse temperature characteristic generating circuit, the temperature characteristic generating circuit, and the output voltage control circuit constitute a feedback loop. When the first and second terminal voltages are equal to each other, an operation of the circuit is stable. Here, the temperature characteristic of the supplied voltage that satisfies conditions such that the first and second terminal voltages are equal to each other is inverse to the temperature characteristic of the predetermined voltage by which the supplied voltage is decreased, so that both the temperature characteristics are canceled. Therefore, a constant voltage independent of temperature is output from the output terminal. In addition, as is different from the conventional art, an output terminal and a ground are not connected via a resistance. Therefore, as compared to the conventional art, current consumption is reduced. Thus, it is easy to design a circuit with low current consumption. Also, it is not necessary to add a circuit that eliminates temperature dependency, as is different from the conventional art, so that the circuit scale can be reduced as compared to the conventional art.

According to a second aspect of the present invention, a constant voltage circuit is provided for outputting a constant voltage from an output terminal thereof. The constant voltage circuit comprises a temperature characteristic generating circuit for controlling a voltage of the output terminal, and an inverse temperature characteristic generating circuit for decreasing the voltage of the output terminal by a predetermined voltage and supplying the resultant voltage to the temperature characteristic generating circuit. The temperature characteristic generating circuit includes a first and a second diode property element having a first terminal and a second terminal, wherein a forward current flows from the first terminal to the second terminal, and the second terminal is grounded, a first resistance provided between a voltage input end via which the voltage supplied from the inverse temperature characteristic generating circuit is input thereto, and the first terminal of the first diode property element, a second and a third resistance provided the voltage input end and the first terminal of the second diode property element, wherein the second and third resistances are connected in series, and a differential amplification circuit for receiving a first terminal voltage between the second and third resistances, and a second terminal voltage of the first terminal of the first diode property element, wherein the differential amplification circuit has an output connected to the output terminal. The temperature characteristic generating circuit has predetermined temperature characteristic with respect to the supplied voltage under conditions such that the first and second terminal voltages are equal to each other. The inverse temperature characteristic generating circuit has inverse temperature characteristic that cancel the predetermined temperature characteristic possessed by the temperature characteristic generating circuit with respect to the predetermined voltage by which the voltage of the output terminal is decreased.

In the second aspect of the present invention, the inverse temperature characteristic generating circuit decreases the voltage of the output terminal by a predetermined voltage and supplies the resultant voltage to the temperature characteristic generating circuit. The temperature characteristic generating circuit receives the voltage supplied from the inverse temperature characteristic generating circuit and controls the voltage of the output terminal. The temperature characteristic generating circuit includes a configuration in which the first resistance and the first diode property element are connected and a configuration in which the second and third resistances and the second diode property element are connected, between the voltage input end to which the supplied voltage is input and the ground. The constant voltage circuit further includes the differential amplification circuit that receives the first terminal voltage between the second and third resistances, and the second terminal voltage between the first resistance and the first diode property element, and has the output connected to the output terminal. The inverse temperature characteristic generating circuit and the temperature characteristic generating circuit constitute a feedback loop. When the first and second terminal voltages are equal to each other, an operation of the circuit is stable. Here, the temperature characteristic of the supplied voltage that satisfies conditions such that the first and second terminal voltages are equal to each other is inverse to the temperature characteristic of the predetermined voltage by which the supplied voltage is decreased, so that both the temperature characteristics are canceled. Therefore, a constant voltage independent of temperature is output from the output terminal. In addition, the constant voltage independent of temperature can be set to have an arbitrary voltage value, but not a voltage value fixed for each set of manufacturing conditions.

According to the present invention, a constant voltage circuit capable of generating a constant voltage independent of temperature can be easily designed to have low current consumption and a small circuit scale.

DETAILED DESCRIPTION OF THE PREFERRED EMBODIMENTS

Hereinafter, embodiments of the present invention will be described with reference to the accompanying drawings. Note that like parts including terminals, etc. and their voltages are indicated by the same reference symbols throughout the specification unless otherwise specified.

First Embodiment

Figure 1:
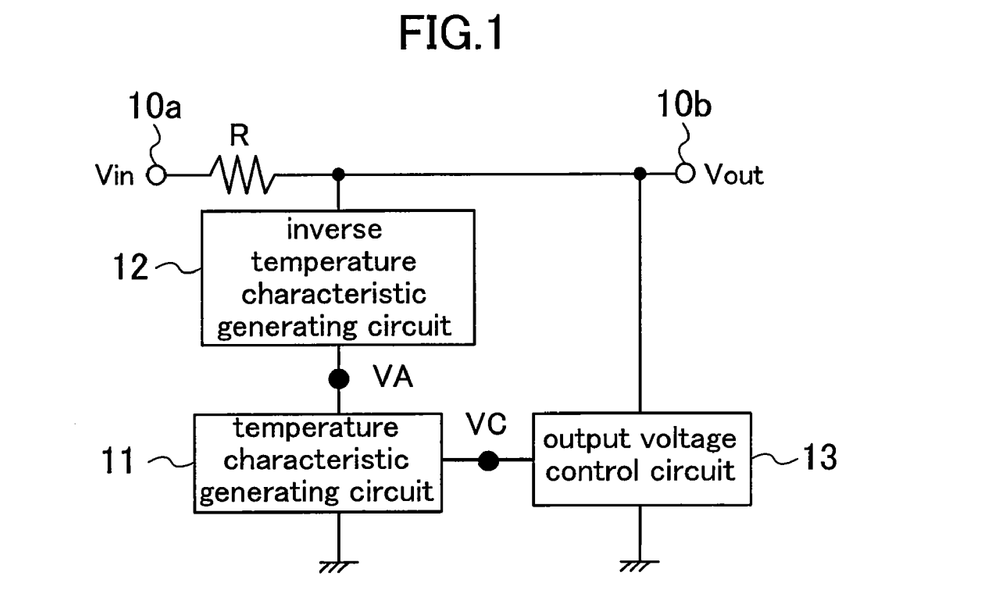
FIG. 1 is a block diagram showing a configuration of a constant voltage circuit according to a first embodiment of the present invention.

FIG. 1 is a block diagram showing a configuration of a constant voltage circuit according to a first embodiment of the present invention. The constant voltage circuit of FIG. 1 receives an input voltage $V_{in}$ at an input terminal 10a, and outputs a constant voltage $V_{out}$ from an output terminal 10b. The input terminal 10a and the output terminal 10b are connected to each other via a resistance R. A series circuit of a temperature characteristic generating circuit 11 and an inverse temperature characteristic generating circuit 12, and an output voltage control circuit 13 are each connected between the output terminal 10b and a ground. A voltage output end of the inverse temperature characteristic generating circuit 12 is connected to a voltage input end of the temperature characteristic generating circuit 11 at a terminal VA. The constant voltage $V_{out}$ is input as a power supply voltage to the output voltage control circuit 13.

The inverse temperature characteristic generating circuit 12 generates a potential difference ($V_{out}$–VA) between the constant voltage $V_{out}$ and a voltage VA, decreases the constant voltage $V_{out}$ by the voltage ($V_{out}$–VA), and supplies the voltage VA via the voltage output end to the temperature characteristic generating circuit 11. The temperature characteristic generating circuit 11 receives the voltage VA supplied from the inverse temperature characteristic generating circuit 12 at the voltage input end, generates a control signal VC based on the supplied voltage VA, and outputs the control signal VC to the output voltage control circuit 13. The output voltage control circuit 13 receives the control signal VC and controls the voltage of the output terminal 10b in accordance with the control signal VC.

Figure 2:
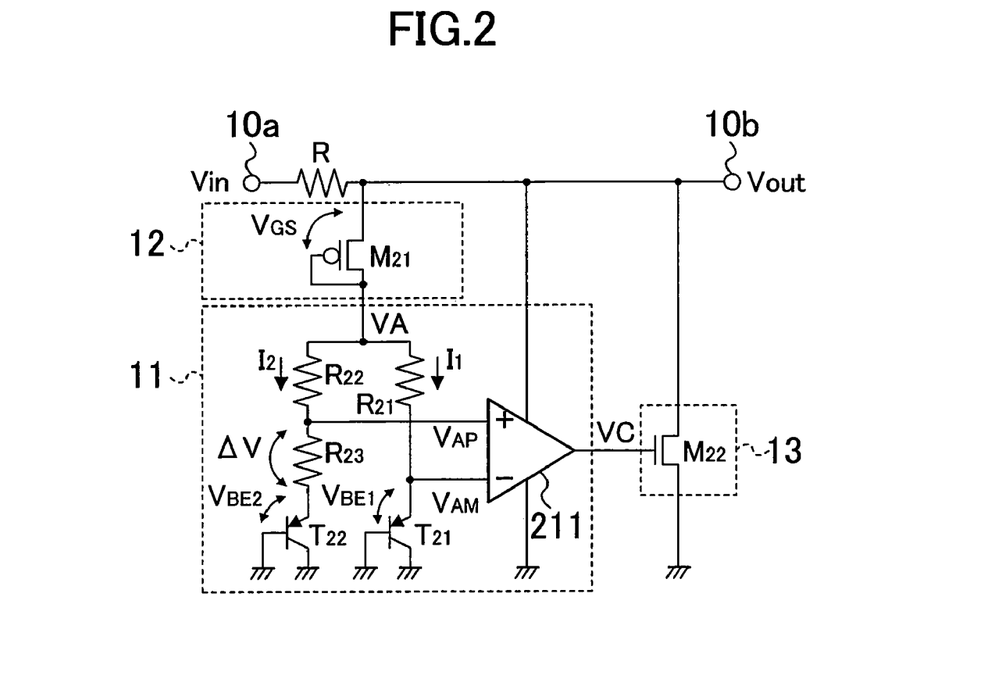
FIG. 2 is a diagram showing a specific exemplary circuit configuration of the constant voltage circuit of FIG. 1.

FIG. 2 is a diagram showing a specific exemplary circuit configuration of the constant voltage circuit of FIG. 1.

In FIG. 2, the temperature characteristic generating circuit 11 comprises PNP bipolar transistors $T_{21}$ and $T_{22}$ that have bases and collectors are grounded. The PNP bipolar transistors $T_{21}$ and $T_{22}$ serve as first and second diode property elements in the present invention, respectively. A first the resistance $R_{21}$ is connected between the emitter of the PNP bipolar transistor $T_{21}$ and the voltage input end to which the voltage VA is input. Second and third resistances $R_{22}$ and $R_{23}$ are connected in series between the emitter of the PNP bipolar transistor $T_{22}$ and the voltage input end. The temperature characteristic generating circuit 11 further comprises a differential amplification circuit 211 that receives a first terminal voltage $V_{AP}$ of a terminal between the second and third resistances $R_{22}$ and $R_{23}$ and a second terminal voltage $V_{AM}$ of the emitter of the PNP bipolar transistor $T_{21}$. The differential amplification circuit 211 receives the voltage $V_{out}$ as a power supply voltage, the first terminal voltage $V_{AP}$ at a non-inverting input terminal thereof, and the second terminal voltage $V_{AM}$ at an inverting input terminal thereof. The differential amplification circuit 211 outputs the control signal VC.

Also, the inverse temperature characteristic generating circuit 12 comprises a PNP transistor $M_{21}$ that has a source connected to the output terminal 10b via which the constant voltage $V_{out}$ is supplied thereto, and a gate and a drain that are connected together and connected to the voltage output end. Specifically, the inverse temperature characteristic generating circuit 12 decreases the constant voltage $V_{out}$ by a gate-source voltage $V_{GS}$ of the PNP transistor $M_{21}$ and outputs the result as the supplied voltage VA. The output voltage control circuit 13 has an NPN transistor $M_{22}$ that has a drain connected to the output terminal 10b via which the constant voltage $V_{out}$ is supplied thereto, a source that is grounded, and a gate at which the control signal VC is received.

In the configuration of FIG. 2, the inverse temperature characteristic generating circuit 12 that receives the constant voltage $V_{out}$ and outputs the voltage VA, the temperature characteristic generating circuit 11 that receives the voltage VA and outputs the control signal VC, and the output voltage control circuit 13 that receives the control signal VC and determines the voltage level of the constant voltage $V_{out}$ constitute a feedback loop. Thereby, the first terminal voltage $V_{AP}$ and the second terminal voltage $V_{AM}$ are caused to have the same voltage level, so that the constant voltage $V_{out}$ and the voltage VA each become constant, resulting in a stable operation.

When a high input voltage $V_{IN}$ is input via the input terminal 10a, the constant voltage $V_{out}$ and the voltage VA become higher than a voltage level at which an operation is stable, so that the first terminal voltage $V_{AP}$ becomes higher than the second terminal voltage $V_{AM}$. In this case, the voltage level of the control signal VC output from the differential amplification circuit 211 becomes high, so that the NPN transistor $M_{22}$ increases a current flowing from the output terminal 10b to the ground so as to decrease the constant voltage $V_{out}$. As a result, the voltage VA also decreases.

On the other hand, when a low input voltage $V_{IN}$ is input via the input terminal 10a, the constant voltage $V_{out}$ and the voltage VA becomes lower than a voltage level at which an operation is stable, so that the first terminal voltage $V_{AP}$ becomes lower than the second terminal voltage $V_{AM}$. In this case, the voltage level of the control signal VC output from the differential amplification circuit 211 becomes low, so that the NPN transistor $M_{22}$ decreases a current flowing from the output terminal 10b to the ground so as to increase the constant voltage $V_{out}$. As a result, the voltage VA also increases.

In other words, the constant voltage $V_{out}$ is controlled by the output voltage control circuit 13 so that the voltage VA supplied from the inverse temperature characteristic generating circuit 12 to the temperature characteristic generating circuit 11 becomes the voltage level at which an operation is stable.

Here, the inverse temperature characteristic generating circuit 12 has temperature characteristic with respect to the predetermined voltage $V_{GS}$ that decreases the constant voltage $V_{out}$. Specifically, when temperature is high, the predetermined voltage $V_{GS}$ is low. When temperature is low, the predetermined voltage $V_{GS}$ is high. Thus, the inverse temperature characteristic generating circuit 12 has negative temperature characteristic.

On the other hand, the temperature characteristic generating circuit 11 has predetermined temperature characteristic with respect to the supplied voltage VA that satisfies conditions such that the first terminal voltage $V_{AP}$ is equal to the second terminal voltage $V_{AM}$. In other words, the level of the supplied voltage VA when a circuit operation is stable (stable operation) varies depending on temperature. Here, it is assumed that when temperature is high, the supplied voltage VA during the stable operation is high, and when temperature is low, the supplied voltage VA during the stable operation is low (i.e., positive temperature characteristic). This temperature characteristic can be achieved by appropriately setting circuit parameters of the temperature characteristic generating circuit 11. The setting of the circuit parameters will be described below.

Figure 3A:
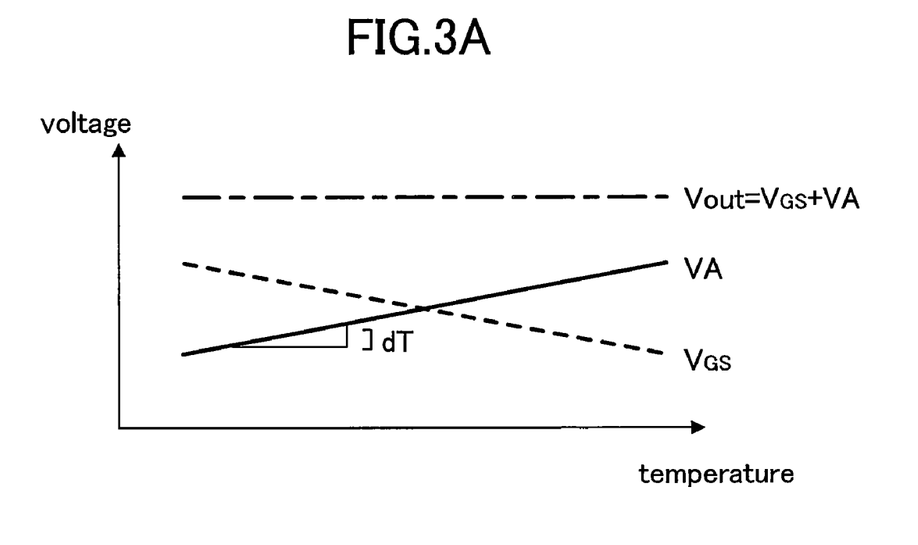
FIG. 3A is a graph showing a relationship between temperature and an output constant voltage $V_{out}$.

It is also assumed in this embodiment that the negative temperature characteristic possessed by the inverse temperature characteristic generating circuit 12 are arranged to cancel the positive temperature characteristic possessed by the temperature characteristic generating circuit 11. Specifically, when temperature is high, the supplied voltage VA during the stable operation is high. In this case, the voltage $V_{GS}$ that decreases the constant voltage $V_{out}$ is low. Therefore, the changes cancel each other, so that the controlled constant voltage $V_{out}$ does not change. On the other hand, when temperature is low, the supplied voltage VA during the stable operation is low. In this case, the voltage $V_{GS}$ that decreases the constant voltage $V_{out}$ is high. Therefore, these changes cancel each other, so that the controlled constant voltage $V_{out}$ does not change. Thus, as shown in FIG. 3A, the positive temperature dependency of the voltage VA and the negative temperature dependency of the voltage $V_{GS}$ cancel each other, so that the constant voltage $V_{out}$ does not have temperature dependency. Thus, according to this embodiment, it is possible to achieve a constant voltage circuit that generates a constant voltage independent of temperature.

Also, the circuit configuration of FIG. 2 does not have a configuration in which an output terminal of a constant voltage is connected to a ground via a resistance, as is different from the conventional art. Therefore, as compared to the conventional art, current consumption is reduced, i.e., it is easy to design a circuit with low current consumption. Also, it is not necessary to add a circuit that eliminates temperature dependency, as is different from the conventional art, so that the circuit scale can be reduced as compared to the conventional art.

Here, a method for setting circuit parameters of the temperature characteristic generating circuit 11 so that the positive temperature characteristic of the temperature characteristic generating circuit 11 are canceled by the negative temperature characteristic of the inverse temperature characteristic generating circuit 12, will be described using the following expressions.

The constant voltage $V_{out}$ is represented by:

$$V_{out} = \frac{R_2 + R_3}{R_3} \Delta V + V_{BE2} + V_{GS} \quad (1)$$

where $\Delta V$ represents a potential difference between the first terminal voltage $V_{AP}$ and the emitter voltage of the PNP bipolar transistor $T_{22}$, $A_1$ represents the area of the emitter of the PNP bipolar transistor $T_{21}$, $V_{BE1}$ represents the base-emitter voltage of the PNP bipolar transistor $T_{21}$, $A_2$ represents the area of the emitter of the PNP bipolar transistor $T_{22}$, $V_{BE2}$ represents the base-emitter voltage of the PNP bipolar transistor $T_{22}$, and $R_1$, $R_2$ and $R_3$ represent the resistance values of the first to third resistances $R_{21}$, $R_{22}$ and $R_{23}$, respectively.

The temperature dependency of the constant voltage $V_{out}$ is represented by differentiating expression (1) with respect to temperature T.

$$\frac{\partial V_{out}}{\partial T} = \frac{R_2 + R_3}{R_3} \frac{\partial \Delta V}{\partial T} + \frac{\partial V_{BE2}}{\partial T} + \frac{\partial V_{GS}}{\partial T} \quad (2)$$

Note that $R_1$, $R_2$ and $R_3$ in expression (2) can be assumed to satisfy the following.

$$\frac{\partial R_1}{\partial T} = \frac{\partial R_2}{\partial T} = \frac{\partial R_3}{\partial T} = 0 \quad (3)$$

On the right side of expression (2), the sum of the first term and the second term indicates the temperature characteristic of the temperature characteristic generating circuit 11, and the third term indicates the temperature characteristic of the inverse temperature characteristic generating circuit 12. Each term has the following sign.

$$\frac{R_2 + R_3}{R_3} \frac{\partial \Delta V}{\partial T} > 0, \ \frac{\partial V_{BE2}}{\partial T} < 0, \ \frac{\partial V_{GS}}{\partial T} < 0 \quad (4)$$

The sum of the terms on the right side of expression (2) needs to be zero so as to eliminate the temperature dependency of the constant voltage $V_{out}$.

$\Delta V$ in expressions (1) and (2) is represented by the following.

$$\Delta V = V_{BE1} - V_{BE2} = \frac{kT}{q} \ln \frac{I_1 A_1}{I_2 A_2} \quad (5)$$

$$\frac{\partial \Delta V}{\partial T} = \frac{k}{q} \ln \frac{I_1 A_1}{I_2 A_2} \quad (6)$$

I1 and I2 in expressions (5) and (6) are represented by the following.

$$I_1 = \frac{1}{R_1}(VA - V_{BE1}) \quad (7)$$

$$I_2 = \frac{1}{R_2 + R_3}(VA - V_{BE2}) \quad (8)$$

Therefore, the circuit parameters of the temperature characteristic generating circuit 11 are set by the second term and the third term of expression (2), and $V_{GS}$, $V_{BE1}$, and $V_{BE2}$, and design values $R_1$, $R_2$, $R_3$, $A_1$, $A_2$, VA, which are known for each set of manufacturing conditions.

Figure 3B:
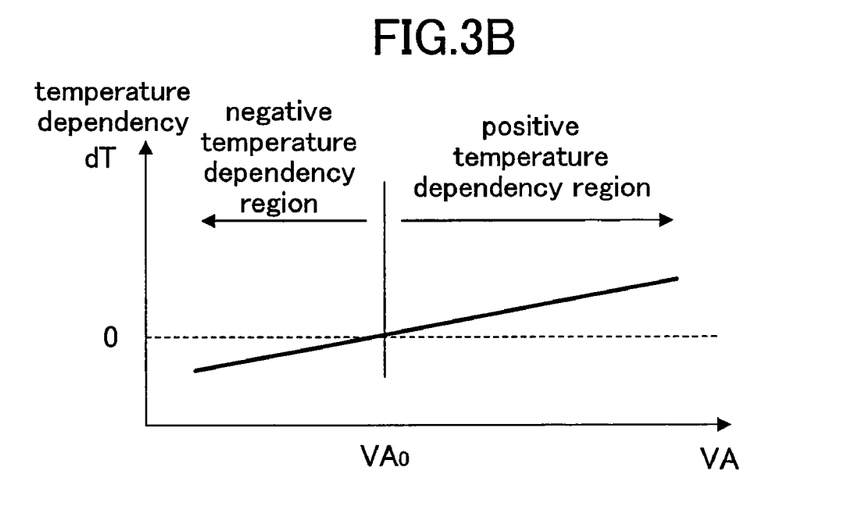
FIG. 3B is a graph showing a relationship between a supplied voltage VA and its temperature dependency during a stable operation.

Note that, as shown in FIG. 3B, the supplied voltage VA during the stable operation has positive temperature characteristic when it is higher than a predetermined voltage $VA_0$, and negative temperature characteristic when it is lower than the voltage $VA_0$. Under manufacturing conditions that are assumed by the present inventors, the voltage VA has positive temperature characteristic when it is about 1.2 V or more, for example. In this case, the constant voltage $V_{out}$ output by the constant voltage circuit of this embodiment is 1.2+$V_{GS}$ or more.

The circuit configuration of the constant voltage circuit of this embodiment is not limited to that shown in FIG. 2. Various configurations may be contemplated.

For example, the inverse temperature characteristic generating circuit 12 may include a plurality of PNP transistors each of which has a gate and a drain connected together as with the PNP transistor $M_{21}$ and which are connected in series, so that the constant voltage $V_{out}$ may be decreased by a voltage corresponding to the total sum of the gate-source voltages of the PNP transistors. Alternatively, a resistance may be connected in series to the PNP transistor $M_{21}$ so as to decrease the constant voltage $V_{out}$.

Figure 4A:
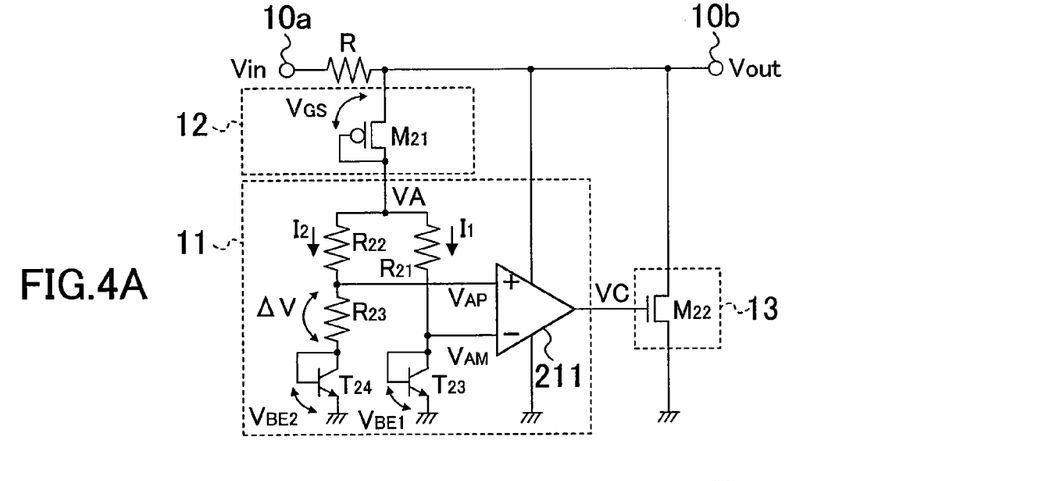
FIGS. 4A to 4C are diagrams showing other specific exemplary circuit configurations of the constant voltage circuit of FIG. 1.
Figure 4B:
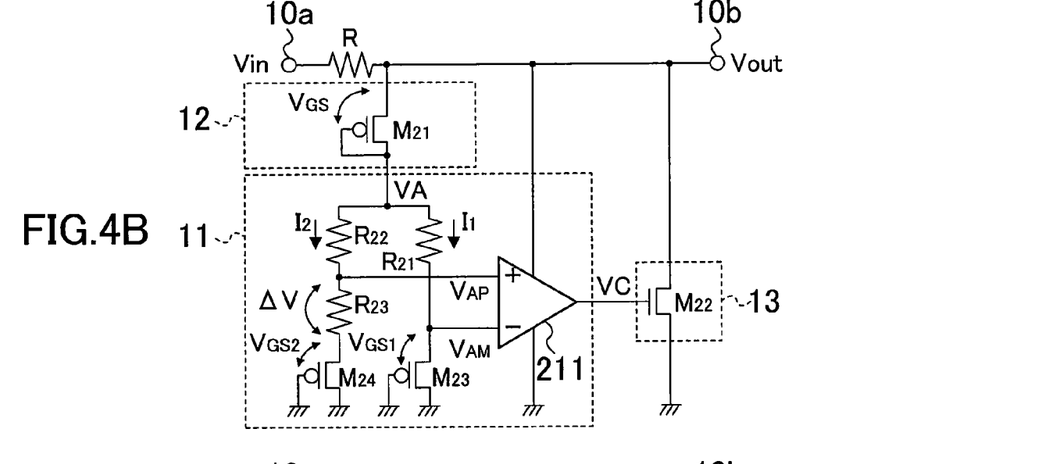
Figure 4C:
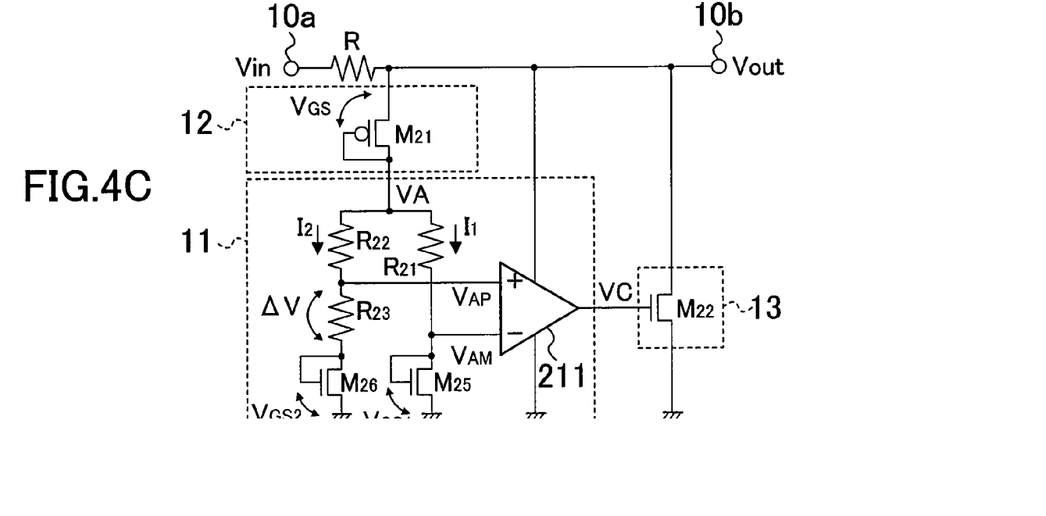
Figure 5:
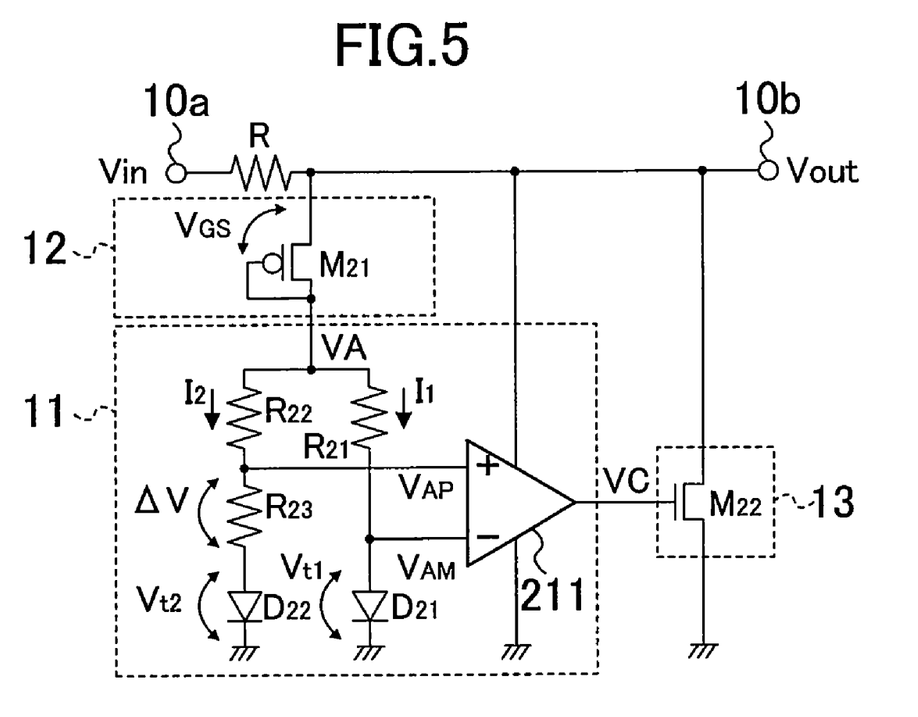
FIG. 5 is a diagram showing another specific exemplary circuit configurations of the constant voltage circuit of FIG. 1.

Also, the PNP bipolar transistors $T_{21}$ and $T_{22}$ of the temperature characteristic generating circuit 11 may be replaced with another kind of elements. For example, NPN bipolar transistors $T_{23}$ and $T_{24}$ are provided in a circuit configuration of FIG. 4A. PNP transistors $M_{23}$ and $M_{24}$ are provided in a circuit configuration of FIG. 4B. NPN transistors $M_{25}$ and $M_{26}$ are provided in a circuit configuration of FIG. 4C. Diodes $D_{21}$ and $D_{22}$ are provided in a circuit configuration of FIG. 5. With these circuit configurations, an operation similar to that of this embodiment can be achieved. Specifically, any element that has a diode property that allows a forward current to flow from a first terminal thereof to a second terminal thereof can be used instead of the PNP bipolar transistors $T_{21}$ and $T_{22}$, where the second terminal is grounded. In the case of the PNP bipolar transistors $T_{21}$ and $T_{22}$, the emitter corresponds to the first terminal and the grounded base and collector correspond to the second terminal.

Figure 6A:
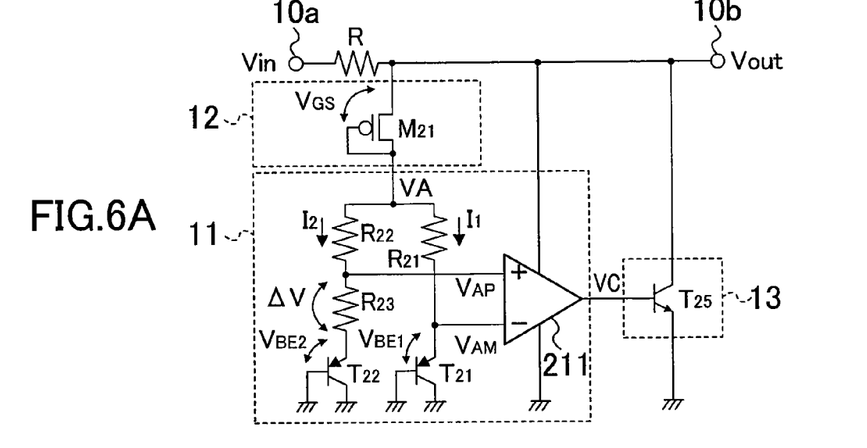
FIGS. 6A to 6C are diagrams showing other specific exemplary circuit configurations of the constant voltage circuit of FIG. 1.
Figure 6B:
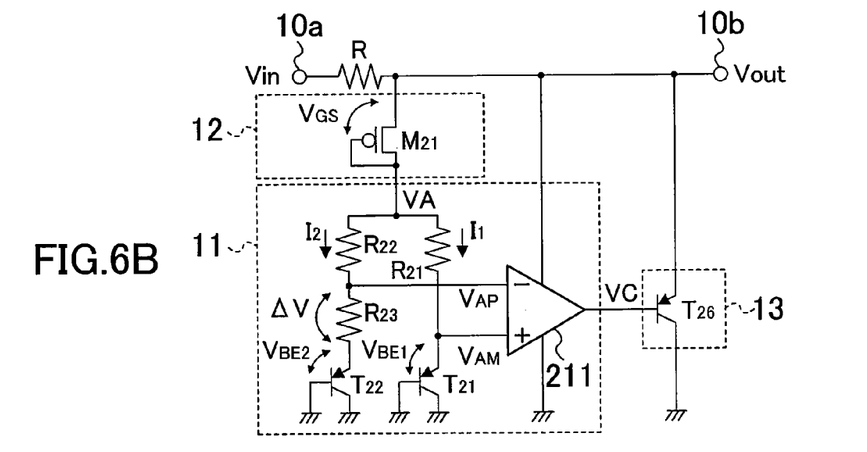
Figure 6C:
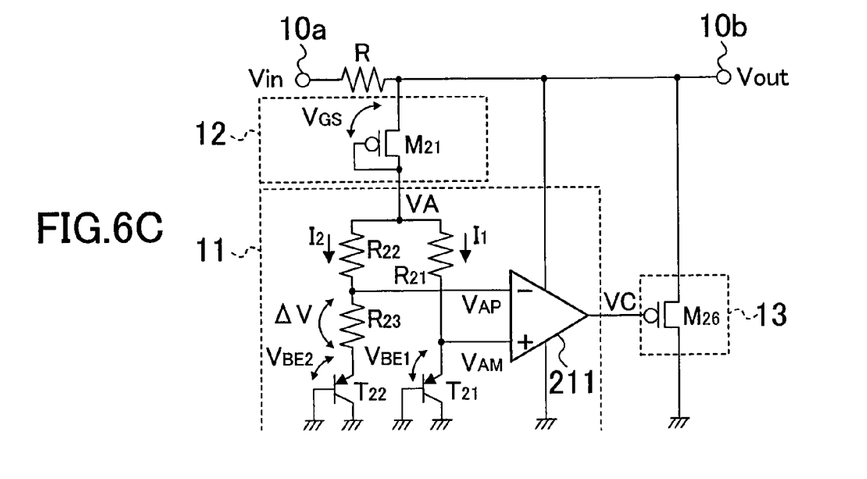

Further, the output voltage control circuit 13 may include an NPN bipolar transistor $T_{25}$ as shown in FIG. 6A or may include a PNP bipolar transistor $T_{26}$ or a PNP transistor $M_{26}$ as shown in FIGS. 6B and 6C. Note that, in the case of FIGS. 6B and 6C, in the differential amplification circuit 211 of the temperature characteristic generating circuit 11, the first terminal voltage $V_{AP}$ is input to the inverting input terminal and the second terminal voltage $V_{AM}$ is input to the non-inverting input terminal.

Also, in the circuit configurations of FIGS. 4A to 4C and FIG. 5, the output voltage control circuit 13 may include an NPN bipolar transistor $T_{25}$ as shown in FIG. 6A. In the differential amplification circuit 211 of the temperature characteristic generating circuit 11, if the first terminal voltage $V_{AP}$ may be input to the inverting input terminal and the second terminal voltage $V_{AM}$ may be input to the non-inverting input terminal, the output voltage control circuit 13 may include a PNP bipolar transistor $T_{26}$ or a PNP transistor $M_{26}$ as shown in FIG. 6B or 6C.

As described above, according to this embodiment, the temperature characteristic of the supplied voltage VA during the stable operation in which the first and second terminal voltages $V_{AP}$ and $V_{AM}$ are equal to each other and the temperature characteristic of the voltage $V_{GS}$ that decreases the constant voltage $V_{out}$ so as to generate the supplied voltage VA cancel each other, so that a constant voltage circuit capable of generating a constant voltage independent of temperature can be achieved. In addition, the output terminal of a constant voltage is not connected via a resistance to a ground. Therefore, as compared to the conventional art, current consumption is reduced, resulting in a circuit that can be easily designed to have low current consumption. Also, as is different from the conventional art, it is not necessary to add a circuit for eliminating temperature dependency, so that the circuit scale can be made smaller than in the conventional art.

Second Embodiment

Figure 7:
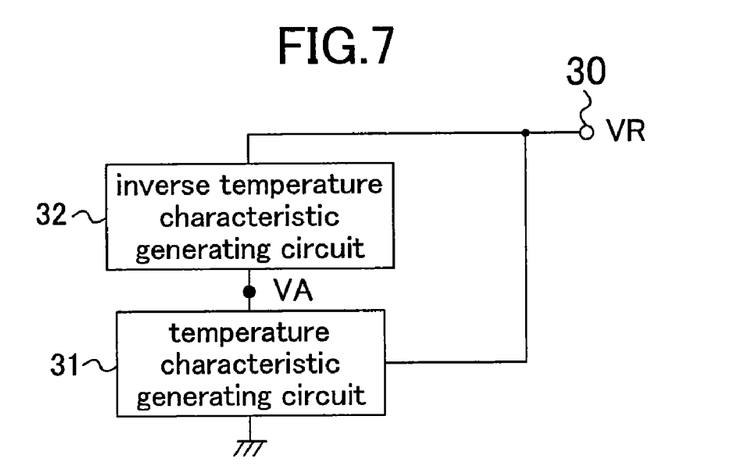
FIG. 7 is a block diagram showing a configuration of a constant voltage circuit according to a second embodiment of the present invention.

FIG. 7 is a block diagram showing a configuration of a constant voltage circuit according to a second embodiment of the present invention. The constant voltage circuit of FIG. 7 outputs a constant voltage VR from an output terminal 30. A series circuit of a temperature characteristic generating circuit 31 and an inverse temperature characteristic generating circuit 32 is connected between the output terminal 30 and a ground. A voltage output end of the inverse temperature characteristic generating circuit 32 is connected to a voltage input end of the temperature characteristic generating circuit 31 at a terminal VA.

The inverse temperature characteristic generating circuit 32 generates a potential difference (VR−VA) between the constant voltage VR and a voltage VA, decreases the constant voltage VR by the voltage (VR−VA), and supplies the voltage VA via the voltage output end to the temperature characteristic generating circuit 31. The temperature characteristic generating circuit 31 receives the voltage VA supplied from the inverse temperature characteristic generating circuit 32 at the voltage input end, generates a voltage based on the supplied voltage VA, and outputs the voltage to the output terminal 30. Thus, the output of the temperature characteristic generating circuit 31 is the constant voltage VR.

Figure 8:
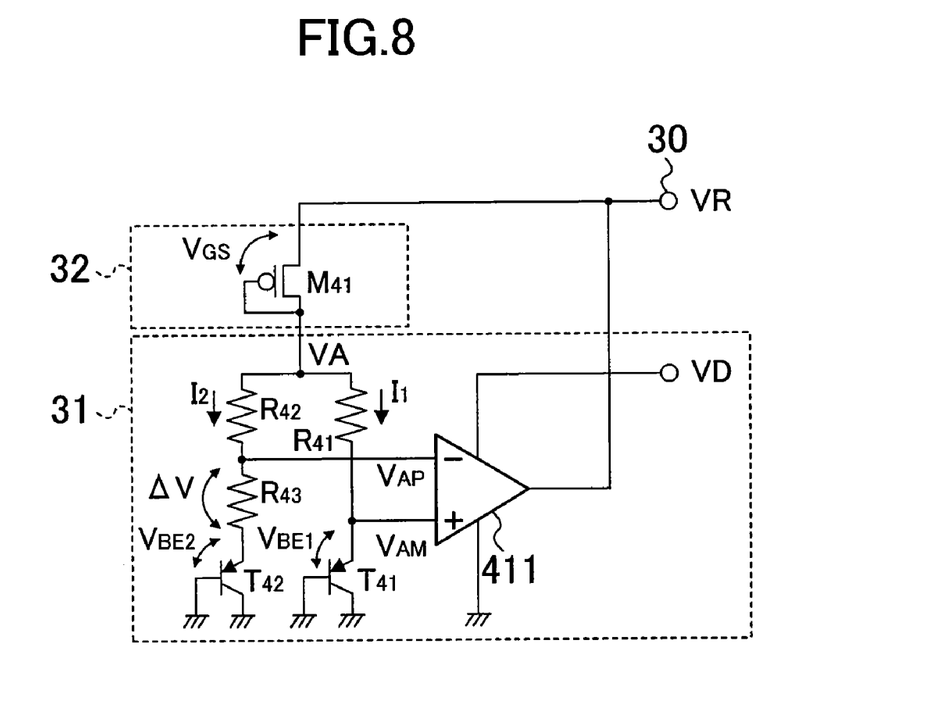
FIG. 8 is a diagram showing a specific exemplary circuit configuration of the constant voltage circuit of FIG. 7.

FIG. 8 is a diagram showing a specific exemplary circuit configuration of the constant voltage circuit of FIG. 7.

In FIG. 8, the temperature characteristic generating circuit 31 comprises PNP bipolar transistors $T_{41}$ and $T_{42}$ that have bases and collectors that are grounded. The PNP bipolar transistors $T_{41}$ and $T_{42}$ serve as first and second diode property elements in the present invention, respectively. A first the resistance $R_{41}$ is connected between the emitter of the PNP bipolar transistor $T_{41}$ and the voltage input end to which the voltage VA is input. Second and third resistances $R_{42}$ and $R_{43}$ are connected in series between the emitter of the PNP bipolar transistor $T_{42}$ and the voltage input end. The temperature characteristic generating circuit 31 further comprises a differential amplification circuit 411 that receives a first terminal voltage $V_{AP}$ of a terminal between the second and third resistances $R_{42}$ and $R_{43}$ and a second terminal voltage $V_{AM}$ of the emitter of the PNP bipolar transistor $T_{41}$. The differential amplification circuit 411 receives a voltage VD as a power supply voltage, the first terminal voltage $V_{AP}$ at a non-inverting input terminal thereof, and the second terminal voltage $V_{AM}$ at an inverting input terminal thereof. The differential amplification circuit 411 has an output connected to the output terminal 30.

Also, the inverse temperature characteristic generating circuit 32 comprises a PNP transistor $M_{41}$, having a source connected to the output terminal 30 via which the constant voltage VR is supplied thereto, and a gate and a drain that are connected together to the voltage output end. Thus, the inverse temperature characteristic generating circuit 32 decreases the constant voltage VR by a gate-source voltage $V_{GS}$ of the PNP transistor $M_{41}$ and outputs the result as the supplied voltage VA.

In the configuration of FIG. 8, the inverse temperature characteristic generating circuit 32 that receives the constant voltage VR and outputs the voltage VA, and the temperature characteristic generating circuit 31 that receives the voltage VA and outputs the constant voltage VR constitute a feedback loop. Thereby, the first terminal voltage $V_{AP}$ and the second terminal voltage $V_{AM}$ are caused to have the same voltage level, so that the constant voltage $V_{out}$ and the voltage VA each become constant, resulting in a stable operation.

When the power supply voltage VD of the differential amplification circuit 411 is applied, then if the constant voltage VR and the voltage VA become higher than a voltage level at which an operation is stable, the first terminal voltage $V_{AP}$ becomes higher than the second terminal voltage $V_{AM}$. In this case, the differential amplification circuit 411 decreases the constant voltage VR. As a result, the voltage VA also decreases. On the other hand, when the power supply voltage VD of the differential amplification circuit 411 is applied, then if the constant voltage VR and the voltage VA are lower than the voltage level at which an operation is stable, the first terminal voltage $V_{AP}$ becomes lower than the second terminal voltage $V_{AM}$. In this case, the differential amplification circuit 411 increases the constant voltage VR. As a result, the voltage VA also increases.

The constant voltage VR is controlled by the temperature characteristic generating circuit 31 so that the voltage VA supplied from the inverse temperature characteristic generating circuit 32 to the temperature characteristic generating circuit 31 becomes the voltage level at which an operation is stable.

Here, the inverse temperature characteristic generating circuit 32 has temperature characteristic with respect to the predetermined voltage $V_{GS}$ that decreases the constant voltage VR. Specifically, when temperature is high, the predetermined voltage $V_{GS}$ is low. When temperature is low, the predetermined voltage $V_{GS}$ is high. Thus, the inverse temperature characteristic generating circuit 32 has negative temperature characteristic.

On the other hand, the temperature characteristic generating circuit 31 has predetermined temperature characteristic with respect to the supplied voltage VA that satisfies conditions such that the first terminal voltage $V_{AP}$ is equal to the second terminal voltage $V_{AM}$. In other words, the level of the supplied voltage VA when a circuit operation is stable (stable operation) varies depending on temperature. Here, it is assumed that when temperature is high, the supplied voltage VA during the stable operation is high, and when temperature is low, the supplied voltage VA during the stable operation is low (i.e., positive temperature characteristic). This temperature characteristic can be achieved by appropriately setting circuit parameters of the temperature characteristic generating circuit 31. The setting of the circuit parameters may be performed in a manner similar to that described in the first embodiment. Note that the constant voltage $V_{out}$ in each expression of the first embodiment is replaced with the constant voltage VR.

It is also assumed in this embodiment that the negative temperature characteristic possessed by the inverse temperature characteristic generating circuit 32 are arranged to cancel the positive temperature characteristic possessed by the temperature characteristic generating circuit 31. In other words, when temperature is high, the supplied voltage VA during the stable operation is high. In this case, the voltage $V_{GS}$ that decreases the constant voltage VR is low. Therefore, the changes cancel each other, so that the controlled constant voltage VR does not change. On the other hand, when temperature is low, the supplied voltage VA during the stable operation is low. In this case, the voltage $V_{GS}$ that decreases the constant voltage VR is high. Therefore, these changes cancel each other, so that the controlled constant voltage VR does not change. Thus, the positive temperature dependency of the voltage VA and the negative temperature dependency of the voltage $V_{GS}$ cancel each other, so that the constant voltage VR does not have temperature dependency. Thus, according to this embodiment, it is possible to achieve a constant voltage circuit that generates a constant voltage independent of temperature.

Note that the power supply voltage VD (not the constant voltage VR) is input to the differential amplification circuit 411, so that the constant voltage VR can be freely set within the range of lower than the power supply voltage VD.

The circuit configuration of the constant voltage circuit of this embodiment is not limited to that shown in FIG. 8. Various configurations may be contemplated.

For example, the inverse temperature characteristic generating circuit 32 may include a plurality of PNP transistors each of which has a gate and a drain connected together as with the PNP transistor $M_{41}$ and which are connected in series, so that the constant voltage VR may be decreased by a voltage corresponding to the total sum of the gate-source voltages of the PNP transistors. Alternatively, a resistance may be connected in series to the PNP transistor $M_{41}$ so as to decrease the constant voltage VR.

Figure 9A:
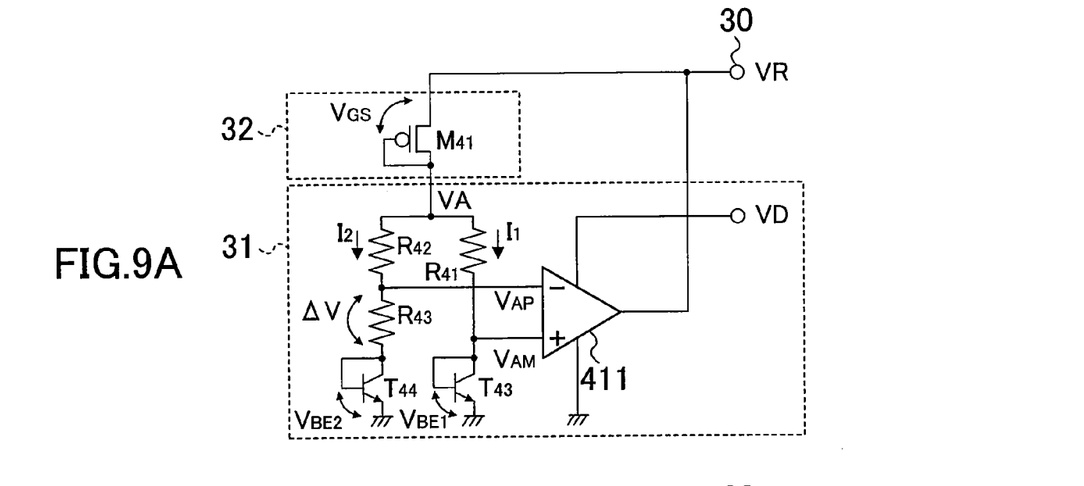
FIGS. 9A to 9C are diagrams showing other specific exemplary circuit configurations of the constant voltage circuit of FIG. 7.
Figure 9B:
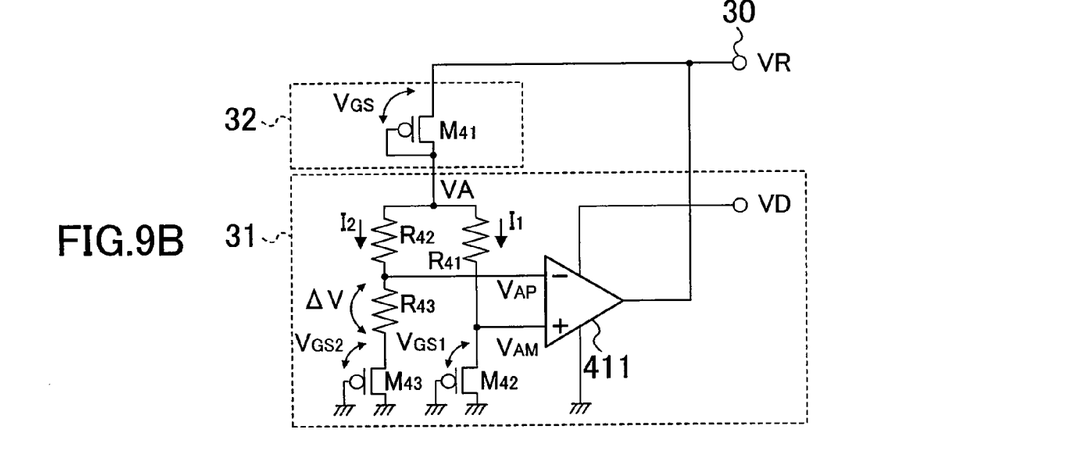
Figure 9C:
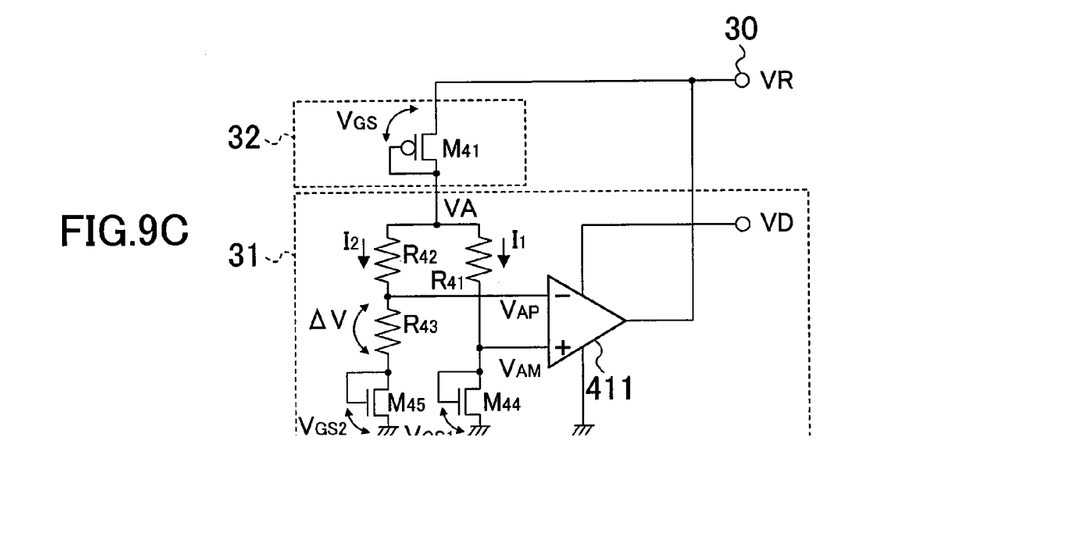
Figure 10:
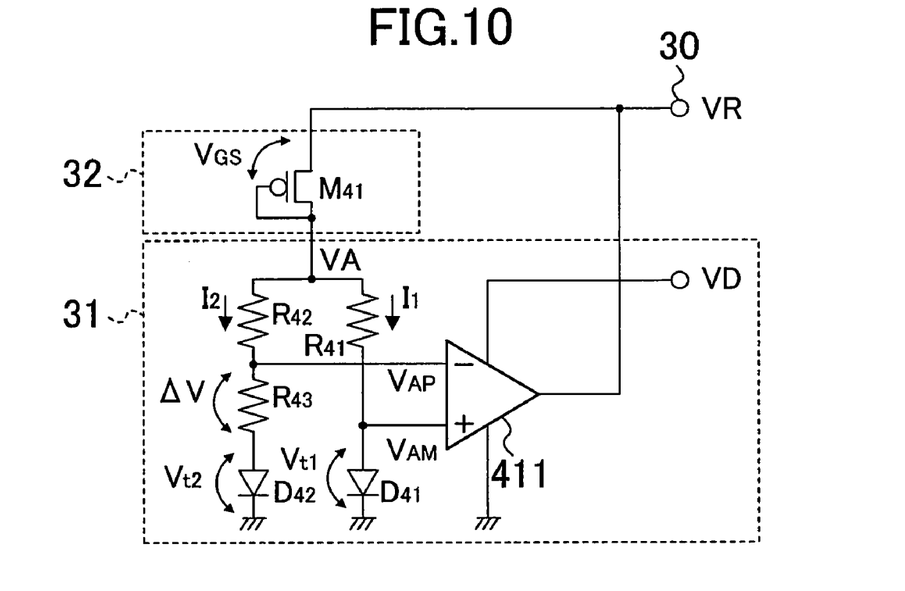
FIG. 10 is a diagram showing another specific exemplary circuit configurations of the constant voltage circuit of FIG. 7.

Also, the PNP bipolar transistors $T_{41}$ and $T_{42}$ of the temperature characteristic generating circuit 31 may be replaced with another kind of elements. For example, NPN bipolar transistors $T_{43}$ and $T_{44}$ are provided in a circuit configuration of FIG. 9A. PNP transistors $M_{42}$ and $M_{43}$ are provided in a circuit configuration of FIG. 9B. NPN transistors $M_{44}$ and $M_{45}$ are provided in a circuit configuration of FIG. 9C. Diodes $D_{41}$ and $D_{42}$ are provided in a circuit configuration of FIG. 10. With these circuit configurations, an operation similar to that of this embodiment can be achieved. Specifically, any element that has a diode property that allows a forward current to flow from a first terminal thereof to a second terminal thereof can be used instead of the PNP bipolar transistors $T_{41}$ and $T_{42}$, where the second terminal is grounded. In the case of the PNP bipolar transistors $T_{41}$ and $T_{42}$, the emitter corresponds to the first terminal and the grounded base and collector correspond to the second terminal.

As described above, according to this embodiment, the temperature characteristic of the supplied voltage VA during a stable operation in which the first and second terminal voltages $V_{AP}$ and $V_{AM}$ are equal to each other and the temperature characteristic of the voltage $V_{GS}$ that decreases the constant voltage VR so as to generate the supplied voltage VA cancel each other, so that a constant voltage circuit capable of generating a constant voltage independent of temperature can be achieved. In addition, the output terminal of a constant voltage is not connected via a resistance to a ground. Therefore, as compared to the conventional art, current consumption is reduced, resulting in a circuit that can be easily designed to have low current consumption. Also, as is different from the conventional art, it is not necessary to add a circuit for eliminating temperature dependency, so that the circuit scale can be made smaller than in the conventional art. Further, as compared to the first embodiment, the voltage level of a constant voltage can be freely set.

According to the present invention, a constant voltage circuit capable of generating a constant voltage independent of temperature can be easily designed to have low current consumption and a small circuit scale. Therefore, such a constant voltage circuit can be useful for a reduction in power consumption or circuit area of an LSI.

What is claimed is:

1. A constant voltage circuit for outputting a constant voltage from an output terminal thereof, comprising:
   an output voltage control circuit for receiving a control signal and controlling a voltage of the output terminal in accordance with the control signal;
   a temperature characteristic generating circuit for generating the control signal; and
   an inverse temperature characteristic generating circuit for decreasing the voltage of the output terminal by a predetermined voltage and supplying the resultant voltage to the temperature characteristic generating circuit,
   wherein the temperature characteristic generating circuit includes:

a first and a second diode property element having a first terminal and a second terminal, wherein a forward current flows from the first terminal to the second terminal, and the second terminal is grounded;

a first resistance provided between a voltage input end via which the voltage supplied from the inverse temperature characteristic generating circuit is input thereto, and the first terminal of the first diode property element;

a second and a third resistance provided the voltage input end and the first terminal of the second diode property element, wherein the second and third resistances are connected in series; and a differential amplification circuit for receiving a first terminal voltage between the second and third resistances, and a second terminal voltage of the first terminal of the first diode property element, and outputting the control signal, wherein the temperature characteristic generating circuit has predetermined temperature characteristic with respect to the supplied voltage under conditions such that the first and second terminal voltages are equal to each other, and the inverse temperature characteristic generating circuit has inverse temperature characteristic that cancel the predetermined temperature characteristic possessed by the temperature characteristic generating circuit with respect to the predetermined voltage by which the voltage of the output terminal is decreased.

2. The constant voltage circuit of claim 1, wherein
the first and second diode property elements are each a PNP bipolar transistor having an emitter as the first terminal and a base and a collector as the second terminal.

3. The constant voltage circuit of claim 1, wherein
the inverse temperature characteristic generating circuit includes a PNP transistor having a source connected to the output terminal, and a gate and a drain connected together to the voltage input end of the temperature characteristic generating circuit.

4. The constant voltage circuit of claim 1, wherein
the output voltage control circuit includes an NPN transistor having a drain connected to the output terminal, a source grounded, and a gate for receiving the control signal.

5. A constant voltage circuit for outputting a constant voltage from an output terminal thereof, comprising:
a temperature characteristic generating circuit for controlling a voltage of the output terminal; and an inverse temperature characteristic generating circuit for decreasing the voltage of the output terminal by a predetermined voltage and supplying the resultant voltage to the temperature characteristic generating circuit, wherein the temperature characteristic generating circuit includes:

a first and a second diode property element having a first terminal and a second terminal, wherein a forward current flows from the first terminal to the second terminal, and the second terminal is grounded;

a first resistance provided between a voltage input end via which the voltage supplied from the inverse temperature characteristic generating circuit is input thereto, and the first terminal of the first diode property element;

a second and a third resistance provided the voltage input end and the first terminal of the second diode property element, wherein the second and third resistances are connected in series; and a differential amplification circuit for receiving a first terminal voltage between the second and third resistances, and a second terminal voltage of the first terminal of the first diode property element, wherein the differential amplification circuit has an output connected to the output terminal, wherein the temperature characteristic generating circuit has predetermined temperature characteristic with respect to the supplied voltage under conditions such that the first and second terminal voltages are equal to each other, and the inverse temperature characteristic generating circuit has inverse temperature characteristic that cancel the predetermined temperature characteristic possessed by the temperature characteristic generating circuit with respect to the predetermined voltage by which the voltage of the output terminal is decreased.

6. The constant voltage circuit of claim 5, wherein
the first and second diode property elements are each a PNP bipolar transistor having an emitter as the first terminal and a base and a collector as the second terminal.

7. The constant voltage circuit of claim 5, wherein
the inverse temperature characteristic generating circuit includes a PNP transistor having a source connected to the output terminal, and a gate and a drain connected together to the voltage input end of the temperature characteristic generating circuit.

* * * * *